US010693411B2

(12) United States Patent
Yu

(10) Patent No.: US 10,693,411 B2
(45) Date of Patent: Jun. 23, 2020

(54) AERIAL VEHICLE, AND OVERVOLTAGE PROTECTION METHOD AND DEVICE OF ELECTRONIC GOVERNOR IN THE SAME

(71) Applicant: Guangzhou Xaircraft Technology Co., LTD., Guangzhou, Guangdong (CN)

(72) Inventor: Jiangtao Yu, Guangdong (CN)

(73) Assignee: GUANGZHOU XAIRCRAFT TECHNOLOGY CO., LTD., Guangzhou, Guangdong (CN)

( * ) Notice: Subject to any disclaimer, the term of this patent is extended or adjusted under 35 U.S.C. 154(b) by 21 days.

(21) Appl. No.: 16/077,326

(22) PCT Filed: Nov. 28, 2017

(86) PCT No.: PCT/CN2017/113395
§ 371 (c)(1),
(2) Date: Aug. 10, 2018

(87) PCT Pub. No.: WO2018/099377
PCT Pub. Date: Jun. 7, 2018

(65) Prior Publication Data
US 2019/0058434 A1 Feb. 21, 2019

(30) Foreign Application Priority Data
Dec. 1, 2016 (CN) .......................... 2016 1 1093576

(51) Int. Cl.
*H02P 29/024* (2016.01)
*B64D 31/00* (2006.01)
(Continued)

(52) U.S. Cl.
CPC .......... *H02P 29/0241* (2016.02); *B64D 27/24* (2013.01); *B64D 31/00* (2013.01);
(Continued)

(58) Field of Classification Search
CPC ...... H02P 29/0241; H02H 3/202; H02H 7/00; B64D 27/24; B64D 31/00
(Continued)

(56) References Cited

U.S. PATENT DOCUMENTS 3,512,068 A 5/1970 Mori
9,018,889 B2 * 4/2015 Patel .................... H02P 9/102
318/805
(Continued)

FOREIGN PATENT DOCUMENTS

CN 1354556 A 6/2002
CN 103227605 A 7/2013
(Continued)

OTHER PUBLICATIONS

International Search Report dated Feb. 6, 2018 for corresponding International Application No. PCT/CN2017/113395, filed Nov. 28, 2017.
(Continued)

*Primary Examiner* — Kawing Chan
(74) *Attorney, Agent, or Firm* — David D. Brush; Westman, Champlin & Koehler, P.A.

(57) ABSTRACT

An overvoltage protection method and device of an electronic governor in an aerial vehicle, and an aerial vehicle with the device are provided. The electronic governor is configured to control a motor. The method includes: collecting a DC bus voltage of the electronic governor; when the DC bus voltage is greater than a first voltage threshold and less than or equal to a second voltage threshold, adjusting a control parameter of the electronic governor based on a difference between the DC bus voltage and the first voltage threshold, such that the electronic governor controls the motor based on the adjusted control parameter to restrain
(Continued)

further rise of the DC bus voltage, in which the second voltage threshold is greater than the first voltage threshold.

9 Claims, 3 Drawing Sheets

(51) Int. Cl.
| | | |
|---|---|---|
| *B64D 27/24* | (2006.01) | |
| *G01R 19/165* | (2006.01) | |
| *G01R 31/00* | (2006.01) | |
| *H02H 7/00* | (2006.01) | |
| *H02H 3/20* | (2006.01) | |
| *B64C 39/02* | (2006.01) | |

(52) U.S. Cl.
CPC ....... *G01R 19/1659* (2013.01); *G01R 31/008* (2013.01); *H02H 3/202* (2013.01); *H02H 7/00* (2013.01); *B64C 39/024* (2013.01); *B64C 2201/042* (2013.01)

(58) Field of Classification Search
USPC .......................................................... 318/434
See application file for complete search history.

(56) References Cited

U.S. PATENT DOCUMENTS

| | | | | |
|---|---|---|---|---|
| 9,083,241 | B2* | 7/2015 | Koiwai | H02M 1/4225 |
| 9,473,028 | B1* | 10/2016 | Hoyt | H02M 3/158 |
| 10,389,292 | B1* | 8/2019 | Lamb | H02P 23/20 |
| 2007/0013338 | A1 | 1/2007 | Swamy et al. | |
| 2009/0040724 | A1* | 2/2009 | Nishikimi | H05K 7/20927 |
| | | | | 361/699 |
| 2011/0188204 | A1* | 8/2011 | Horiuchi | H01L 23/473 |
| | | | | 361/702 |
| 2011/0309779 | A1* | 12/2011 | Hiti | B60L 3/0061 |
| | | | | 318/400.27 |
| 2013/0049648 | A1* | 2/2013 | Rozman | B60R 16/03 |
| | | | | 318/139 |
| 2013/0214717 | A1* | 8/2013 | Ishikawa | H02M 7/53875 |
| | | | | 318/503 |
| 2013/0328510 | A1* | 12/2013 | Sato | H02P 6/06 |
| | | | | 318/400.04 |
| 2014/0354040 | A1* | 12/2014 | Reichow | B60R 16/03 |
| | | | | 307/9.1 |
| 2015/0001932 | A1* | 1/2015 | Inoue | G05F 1/67 |
| | | | | 307/24 |
| 2015/0137786 | A1 | 5/2015 | Maddali et al. | |
| 2016/0233816 | A1* | 8/2016 | Je | H02P 6/08 |

FOREIGN PATENT DOCUMENTS

| | | |
|---|---|---|
| CN | 103501135 A | 1/2014 |
| CN | 105449639 A | 3/2016 |
| CN | 106655979 A | 5/2017 |
| JP | S61231885 A | 10/1986 |
| JP | 2007116773 A | 5/2007 |
| KR | 20080062897 A | 7/2008 |

OTHER PUBLICATIONS

English translation of the Japanese Office Action dated May 23, 2019, for corresponding Japanese Application No. 2018-530519.

Office Action dated Mar. 29, 2019 for corresponding Australian Application No. 2017370239.

English translation of an Office Action from SIPO, dated Jun. 19, 2018, for CN Application No. 201611093576.2.

English translation of the International Written Opinion dated Feb. 26, 2018 for corresponding International Application No. PCT/CN2017/113395, filed Nov. 28, 2017.

English translation of the Office Action dated Sep. 24, 2019, for corresponding Korean Application No. 10-2018-7014953.

* cited by examiner

AERIAL VEHICLE, AND OVERVOLTAGE PROTECTION METHOD AND DEVICE OF ELECTRONIC GOVERNOR IN THE SAME

CROSS REFERENCE TO RELATED APPLICATION

This application is a Section 371 National Stage Application of International Application No. PCT/CN2017/113395, filed Nov. 28, 2017, which is based upon and claims a priority to Chinese Patent Application No. 201611093576.2, filed on Dec. 1, 2016, the entire contents of which are incorporated herein by reference.

TECHNICAL FIELD

The present disclosure relates to a field of aerial vehicle technologies, and more particularly, to an overvoltage protection method of an electronic governor in an aerial vehicle, an overvoltage protection device of an electronic governor in an aerial vehicle, and an aerial vehicle with the device.

BACKGROUND

In a related aerial vehicle such as an unmanned aerial vehicle, stability of an electronic governor and a motor, serving as a power system of the aerial vehicle, may guarantee normal flight of the aerial vehicle. In the related art, the output of most of the electronic governors in the aerial vehicles may be cut off only when a direct current (DC) bus voltage thereof exceeds a preset value. Therefore, the output of the electronic governor may be cut off when the aerial vehicle is flying in a large action, thereby causing damage to the aerial vehicle.

Therefore, it needs to improve the related art.

SUMMARY

An embodiment of an aspect of the present disclosure provides an overvoltage protection method for an electronic governor in an aerial vehicle. The electronic governor is configured to control a motor. The method includes: collecting a direct voltage (DC) bus voltage of the electronic governor; when the DC bus voltage is greater than a first voltage threshold and less than or equal to a second voltage threshold, adjusting a control parameter of the electronic governor based on a difference between the DC bus voltage and the first voltage threshold, such that the electronic governor controls the motor based on the adjusted control parameter to restrain further rise of the DC bus voltage, in which the second voltage threshold is greater than the first voltage threshold.

An embodiment of another aspect of the present disclosure provides an overvoltage protection device for an electronic governor in an aerial vehicle. The electronic governor is configured to control a motor. The device includes: a memory comprising computer-executable instructions stored thereon; and a processor, which is configured by the instructions to implement acts of: collecting a direct voltage (DC) bus voltage of the electronic governor; when the DC bus voltage is greater than a first voltage threshold and less than or equal to a second voltage threshold, adjusting a control parameter of the electronic governor based on a difference between the DC bus voltage and the first voltage threshold, such that the electronic governor controls the motor based on the adjusted control parameter to restrain further rise of the DC bus voltage, in which the second voltage threshold is greater than the first voltage threshold.

An embodiment of still another aspect of the present disclosure provides an aerial vehicle. The aerial vehicle includes the overvoltage protection device for an electronic governor in an aerial vehicle.

DETAILED DESCRIPTION

Figure 1:
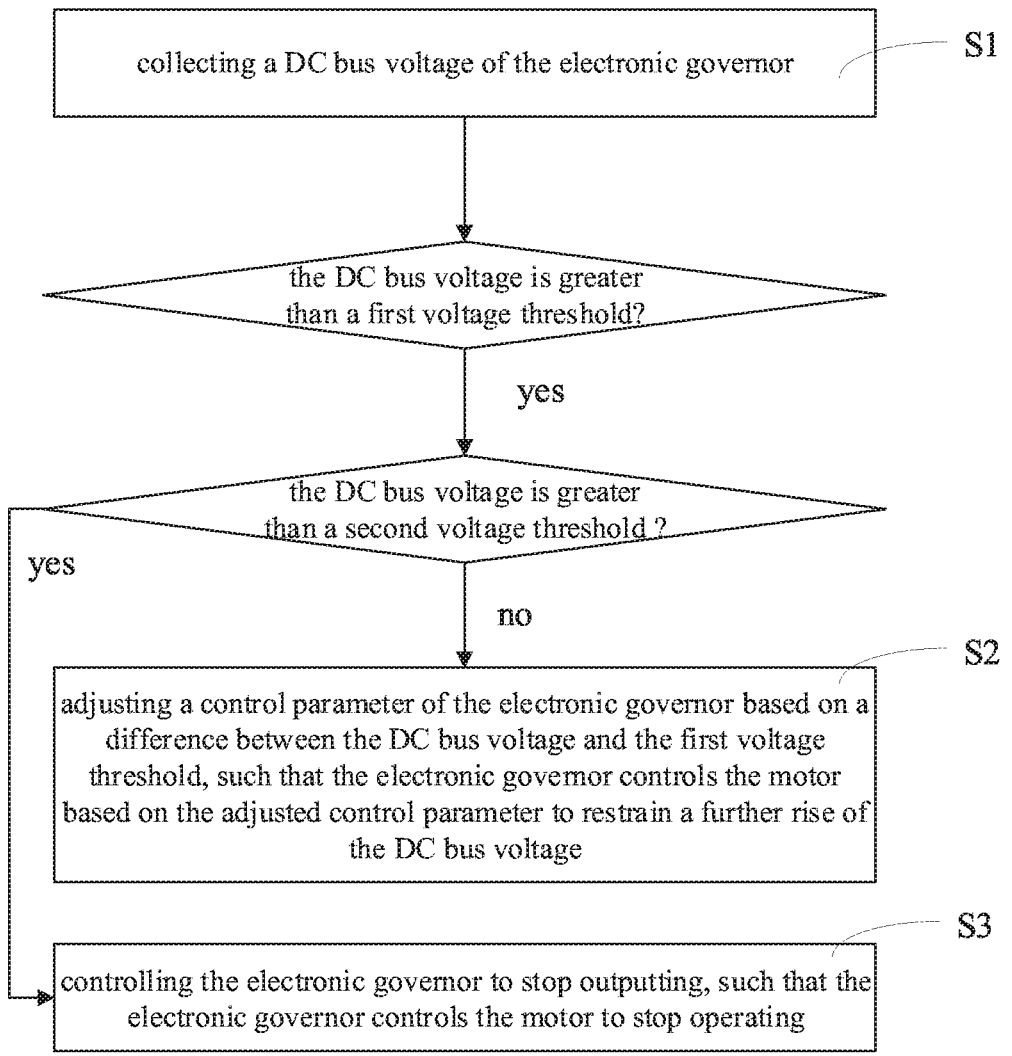
FIG. 1 is a flow chart illustrating an overvoltage protection method for an electronic governor in an aerial vehicle according to an embodiment of the present disclosure.

Reference will now be made in detail to embodiments of the present disclosure, examples of which are illustrated in the accompanying drawings. The same or similar elements and elements having same or similar functions are denoted by like reference numerals throughout the descriptions. The embodiments described herein with reference to the accompanying drawings are explanatory and used to generally understand the present disclosure, which is not construed to limit the embodiments of the present disclosure.

First, the applicant has discovered and realized that during a large-action flight of the aerial vehicle, the motor may rapidly decelerate. Because the motor with paddles has a certain inertia, it will feedback energy to the electronic governor when it decelerates, so that a bus voltage of the electronic governor rises. Especially if the battery is fully charged, it may cause an overvoltage of the electronic governor. If the output of the electronic governor is cut off due to the overvoltage when the aerial vehicle is flying in the large action, the aerial vehicle may be damaged or even crashed.

Hereinafter, an overvoltage protection method for an electronic governor in an aerial vehicle, an overvoltage protection device for an electronic governor in an aerial vehicle, and an aerial vehicle with the device according to the embodiments of the present disclosure will be described with reference to the accompanying drawings.

FIG. 1 is a flow chart illustrating an overvoltage protection method for an electronic governor in an aerial vehicle according to an embodiment of the present disclosure. The electronic governor is configured to control a motor. The electronic governor may include capacitors, MOSFETs (Metal-Oxide-Semiconductor Field-Effect Transistors) and other components.

As illustrated in FIG. 1, the overvoltage protection method according to the embodiment of the present disclosure includes the following steps.

At S1, a direct voltage (DC) bus voltage of the electronic governor is collected.

The electronic governor may include a full-bridge inverter circuit composed of six MOSFETs. The full-bridge inverter circuit may include three phase bridge arms. Each phase bridge arm may include two MOSFETs. The DC bus voltage is a voltage applied on the two MOSFETs of each phase bridge arm.

At S2, when the DC bus voltage is greater than a first voltage threshold and less than or equal to a second voltage threshold, a control parameter of the electronic governor is adjusted based on a difference between the DC bus voltage and the first voltage threshold, such that the electronic governor controls the motor based on the adjusted control parameter to restrain further rise of the DC bus voltage. The second voltage threshold is greater than the first voltage threshold.

At S3, when the DC bus voltage is greater than the second voltage threshold, the electronic governor is controlled to stop outputting, such that the electronic governor controls the motor to stop operating.

It should be understood that capacitors, MOSFETs and other components in the electronic governor have a voltage limit. If the DC bus voltage is greater than the second voltage threshold, it may cause the voltage applied to the capacitors, MOSFETs, etc. to exceed a voltage limit value itself, thereby damaging or even burning the components.

In one or more embodiments of the present disclosure, the overvoltage protection function of the electronic governor may be enabled through software, and after the overvoltage protection function is enabled, the DC bus voltage of the electronic governor may be collected in real time.

When the DC bus voltage is less than the first voltage threshold, it is determined at this time that the electronic governor does not have overvoltage. The overvoltage protection is not performed, and the electronic governor may control the motor based on a preset control parameter. Thus, there is no effect on normal flight.

When the DC bus voltage is greater than the first voltage threshold and less than or equal to the second voltage threshold, it is determined at this time that the rise of the DC bus voltage is caused by the large-action flight of the aerial vehicle, i.e., when the aerial vehicle performs the large action during the flight, the motor will rapidly accelerate or decelerates, and when the motor decelerates, the inertia of the motor with the paddles will feed back energy to the electronic governor to rise the DC bus voltage. When the deceleration is faster, the faster the energy is fed back, such that the DC bus voltage may exceed the first voltage threshold. At this time, by adjusting the control parameter to reduce a change rate of a rotational speed of the motor, to reduce the energy fed back by the motor, and to restrain the further rise of the DC bus voltage, it may ensure rapid acceleration and deceleration of the electronic governor in the voltage safety range to prevent the electronic components from failing because of the occurrence of the overvoltage of the DC bus voltage.

When the DC bus voltage is greater than the second voltage threshold, it is determined at this time that the overvoltage of the electronic governor is caused by an abnormal condition, i.e., when the electronic governor has an abnormal condition such as an inputted overvoltage, the DC bus voltage may exceed the second voltage threshold. At this time, the electronic governor stops outputting to control the motor to stop running, and an alarm may also be performed correspondingly.

Therefore, with a two-stage voltage protection adopted in the embodiments of the present disclosure, by the effective control on the overvoltage condition that may be generated during the flight, the electronic governor may operate within the safe voltage range, which may reduce the damage of the electronic components caused by the overvoltage of the electronic governor, and thus more safely ensuring the safety of the flight process.

In some embodiments of the present disclosure, the control parameter includes a given speed, a quadrature axis given current or a quadrature axis given voltage. In other words, the overvoltage protection of the DC bus voltage may be performed by various way, such as by limiting the given speed, the quadrature axis given current or the quadrature axis given voltage.

In detail, in some embodiments of the present disclosure, the control parameter of the electronic governor is adjusted based on the difference between the DC bus voltage and the first voltage threshold as follows. A superimposition parameter is generated based on the difference between the DC bus voltage and the first voltage threshold and a preset PI control algorithm. Superimposition processing is performed on the superposition parameter and the control parameter based on a direction of a current speed of the motor, such that the electronic governor controls a rotational speed of the motor based on the superimposed control parameter.

Further in some embodiments of the present disclosure, the superimposition processing is performed on the superposition parameter and the control parameter based on the direction of the current speed of the motor as follows. When the direction of the current speed of the motor is a forward direction, the superposition parameter is superimposed to the control parameter. When the direction of the current speed of the motor is a reversal direction, a negative of the superposition parameter is superimposed to the control parameter.

In the following, with reference to FIGS. 2-4, an overvoltage protection method by limiting the given speed, the quadrature axis given current or the quadrature axis given voltage according to embodiments of the present disclosure will be described.

Figure 2:
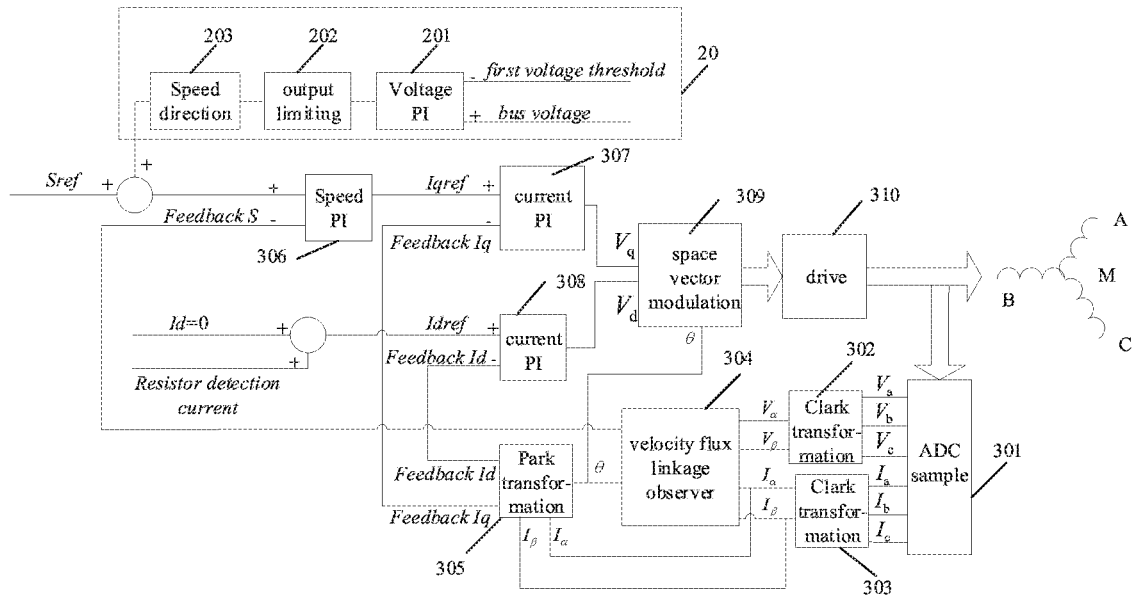
FIG. 2 is a control block diagram illustrating an overvoltage protection method for an electronic governor in an aerial vehicle according to a specific embodiment of the present disclosure.

In a specific embodiment of the present disclosure, as illustrated in FIG. 2, when the control parameter is the given speed, the superposition parameter is a superposition speed. The control parameter of the electronic governor is adjusted based on the difference between the DC bus voltage and the first voltage threshold as follows. A superimposition speed is generated based on the difference between the DC bus voltage and the first voltage threshold and a first preset PI control algorithm. Superimposition processing is performed on the superposition speed and the given speed Sref based on a direction of a current speed of the motor, such that the electronic governor controls a rotational speed of the motor based on the superimposed given speed.

In one or more embodiments of the present disclosure, the first preset PI control algorithm may be denoted by a formula of $$\text{Out}=K_{sp}*[(V_{BUS}-V_{SET1})+K_{si}\int(V_{BUS}-V_{SET1})dt]$$

where $V_{BUS}$ represents the DC bus voltage, $V_{SET1}$ represents the first voltage threshold, $K_{sp}$ represents a corresponding proportional control parameter, and $K_{si}$, represents a corresponding integral control parameter.

In addition, before superposition processing, limiting may be performed on the superimposition parameter such as the superimposition speed, i.e., $\text{Out}\in[0, \text{Spd}_{Max}]$. If the superimposition speed is greater than an upper limit value $\text{Spd}_{Max}$ of a first limiting range, the superimposition speed is limited to $Spd_{Max}$, and if the superimposition speed is less than a lower limit value 0 of the first limiting range, the superimposition speed is limited to 0.

Further, the superimposition processing is performed on the superposition speed and the given speed Sref based on the direction of the current speed of the motor as follows. When the direction of the current speed of the motor is a forward direction, i.e., Sref>0, the superposition speed is superimposed to the given speed Sref. When the direction of the current speed of the motor is a reversal direction, i.e., Sref<0, a negative of the superposition speed is superimposed to the given speed Sref.

In detail, as illustrated in FIG. 2, after the overvoltage protection function is enabled by software, when the DC bus voltage is less than the first voltage threshold, the superimposition speed may be limited to 0 by the limiting output of the limiting algorithm Out∈[0, $Spd_{Max}$], such that there is no effect on normal flight.

When the aerial vehicle performs the large action during the flight, the motor will rapidly accelerate or decelerate, and when the motor decelerates, the inertia of the motor with the paddles will feed back energy to the electronic governor to rise the DC bus voltage of the electronic governor. When the deceleration is faster, the faster the energy is fed back, such that the DC bus voltage may exceed the first voltage threshold. At this time, the difference of the DC bus voltage minus the first voltage threshold is taken as the input of the first PI control module. The difference is processed by the first preset PI control algorithm Out=$K_{sp}*[(V_{BUS}-V_{SET1})+K_{sI}\int(V_{BUS}-V_{SET1})dt]$ to output a positive superimposition speed and the superimposition speed is superimposed on the given speed Sref by combining with the direction of the speed of the motor. That is, when the direction of the speed of the motor is a forward direction, the superposition speed Out×1 is superimposed on the given speed Sref, when the direction of the speed of the motor is a reversal direction, the superposition speed Out×(−1) is superimposed on the given speed Sref.

Therefore, the given speed Sref is adjusted to the given speed after the superposition speed is superimposed, and the electronic governor will also control the motor according to the superimposed given speed, which may be as follows.

A collecting module collects currents of three phases, Ia, Ib and Ic and voltages of three phases, Va, Vb and Vc in the motor; a first Clarke coordinate transformation unit transforms the voltages Va, Vb and Vc to obtain voltages of two phases, Vα and Vβ based on Clarke coordinate transformation; a second Clarke coordinate transformation unit transforms the currents Ia, Ib and Ic to obtain currents of two phases, Iα and Iβ based on Clarke coordinate transformation; a position estimating unit such as a velocity flux linkage observer, based on the voltages Vα and Vβ and the current Iα and Iβ estimates a position and a speed of a rotor of the motor to obtain an estimated angle θ of the rotor and an estimated speed S of the rotor; a park coordinate transformation unit performs park coordinate transformation on the currents Iα and Iβ based on the estimated angle θ of the rotor to obtain a direct axis current Id and a quadrature axis current Iq.

The given speed Sref is superimposed with the superposition speed; a speed correction module performs speed correction on the estimated speed S of the rotor based on the superimposed given speed to obtain the quadrature axis given current Iqref, a first current correction unit, based on to the direct axis given current Idref, performs current correction on the direct axis current Id to obtain the direct axis voltage Vd; a second current correction unit, based on the quadrature axis given current Idreq, performs current correction on the quadrature axis current Iq to obtain the quadrature axis given voltage Vq; a space vector modulation unit, based on the estimated angle θ, performs space vector modulation on the direct axis voltage Vd and the quadrature axis voltage Vq to generate a drive signal; a drive unit drives the motor based on the drive signal.

Thus, during the deceleration, by superimposing the positive or negative superposition speed on the given speed Sref, the rapid decrease of the given speed Sref may be suppressed, thereby reducing the regenerative energy due to the rapid deceleration of the motor with the paddles, restraining the rise of the DC bus voltage and limiting the DC bus voltage below the first preset voltage to ensure rapid acceleration and deceleration of the electronic governor in the voltage safety range to prevent the electronic components from failing because of the occurrence of the overvoltage of the DC bus voltage.

In addition, when the electronic governor has an abnormal condition such as an inputted overvoltage, the DC bus voltage may exceed the second voltage threshold. At this time, the electronic governor stops outputting to control the motor to stop running, and an alarm may also be performed correspondingly.

Figure 3:
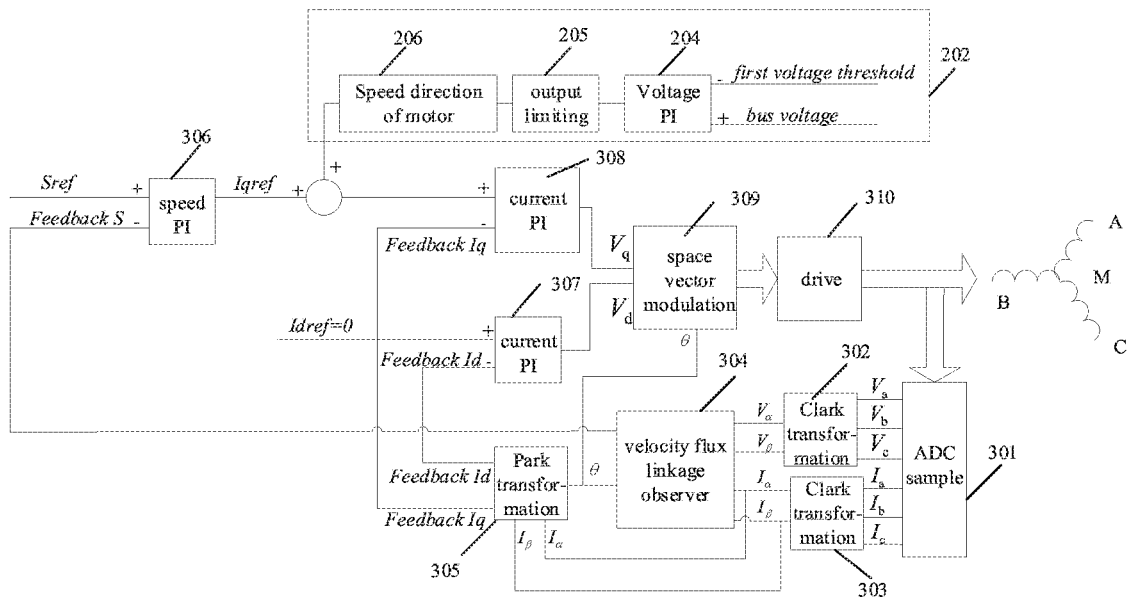
FIG. 3 is a control block diagram illustrating an overvoltage protection method for an electronic governor in an aerial vehicle according to another specific embodiment of the present disclosure.

In another specific embodiment of the present disclosure, as illustrated in FIG. 3, when the control parameter is the quadrature axis given current, the superposition parameter is a superposition current. The control parameter of the electronic governor is adjusted based on the difference between the DC bus voltage and the first voltage threshold as follows. A superimposition current is generated based on the difference between the DC bus voltage and the first voltage threshold and a second preset PI control algorithm. Superimposition processing is performed on the superposition current and the quadrature axis given current Iqref based on a direction of the quadrature axis given current, such that the electronic governor controls a rotational speed of the motor based on the superimposed quadrature axis given current.

In one or more embodiments of the present disclosure, the second preset PI control algorithm may be denoted by a formula of $$Out=K_{Ip}*[(V_{BUS}-V_{SET1})+K_{II}\int(V_{BUS}-V_{SET1})dt]$$

where $V_{BUS}$ represents the DC bus voltage, $V_{SET1}$ represents the first voltage threshold, $K_{Ip}$ represents a corresponding proportional control parameter, and $K_{II}$ represents a corresponding integral control parameter.

In addition, before superposition processing, limiting may be performed on the superimposition parameter such as the superimposition current, i.e., Out∈[0, $Iq_{Max}$]. If the superimposition current is greater than an upper limit value $Iq_{Max}$ of a second limiting range, the superimposition current is limited to $Iq_{Max}$, and if the superimposition current is less than a lower limit value 0 of the second limiting range, the superimposition current is limited to 0.

Further, the superimposition processing is performed on the superposition current and the quadrature axis given current based on a direction of quadrature axis given current as follows. When the direction of the current speed of the motor is a forward direction, the superposition current is superimposed to the quadrature axis given current Iqref. When the direction of the current speed of the motor is a reversal direction, a negative of the superposition current is superimposed to the quadrature axis given current Iqref.

In detail, as illustrated in FIG. 3, after the overvoltage protection function is enabled by software, when the DC bus voltage is less than the first voltage threshold, the superimposition current may be limited to 0 by the limiting output of the limiting algorithm Out∈[0, $Iq_{Max}$], such that there is no effect on normal flight.

When the aerial vehicle performs the large action to make the DC bus voltage to exceed the first voltage threshold, the difference of the DC bus voltage minus the first voltage threshold is taken as the input of the second PI control module. The difference is processed by the second preset PI control algorithm Out=$K_{Ip}$*[$(V_{BUS}-V_{SET1})+K_{II}\int(V_{BUS}-V_{SET1})dt$] to output a positive superimposition current and the superimposition current is superimposed on the quadrature axis given current Iqref by combining with the direction of the speed of the motor. That is, when the direction of the speed of the motor is a forward direction, the superposition current Out×1 is superimposed on the quadrature axis given current Iqref; when the direction of the speed of the motor is a reversal direction, the superposition current Out×(−1) is superimposed on the quadrature axis given current Iqref.

Therefore, the quadrature axis given current Iqref is adjusted to the quadrature axis given current after the superposition current is superimposed, and the electronic governor will also control the motor according to the superimposed quadrature axis given current. The specific control flow is basically consistent with the control according to the given speed after the superposition speed is superimposed. The difference may be as follows. The speed correction module performs speed correction on the estimated speed S of the rotor based on the given speed to obtain the quadrature axis given current Iqref, the quadrature axis given current Iqref is superimposed with the superimposition current; the second current correction unit, based on the quadrature axis given current Idreq after superimposition, performs current correction on the quadrature axis current Iq to obtain the quadrature axis given voltage Vq.

In addition, when the electronic governor has an abnormal condition such as an inputted overvoltage, the DC bus voltage may exceed the second voltage threshold. At this time, the electronic governor stops outputting to control the motor to stop running, and an alarm may also be performed correspondingly.

Figure 4:
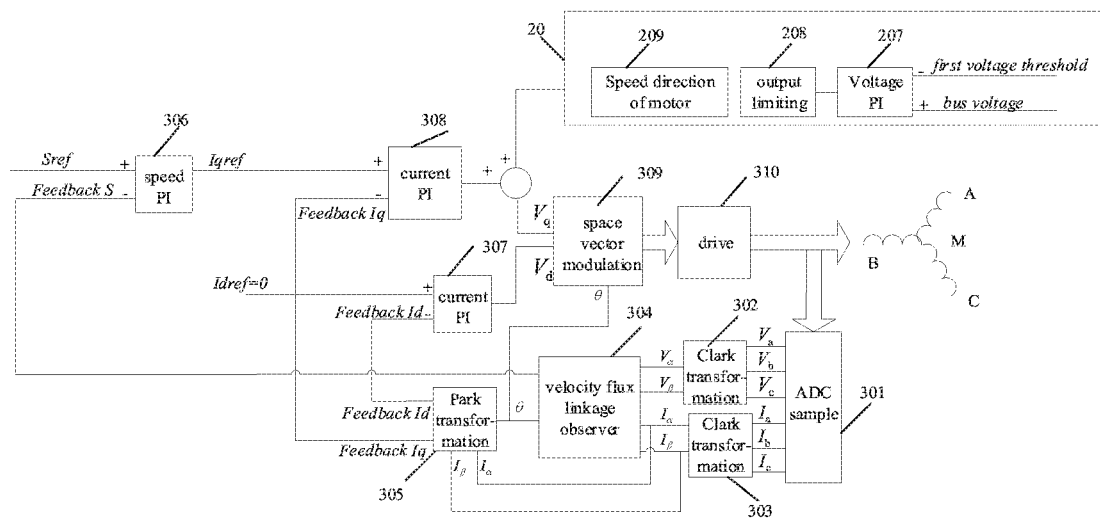
FIG. 4 is a control block diagram illustrating an overvoltage protection method for an electronic governor in an aerial vehicle according to still another specific embodiment of the present disclosure.

In still another specific embodiment of the present disclosure, as illustrated in FIG. 4, when the control parameter is the quadrature axis given voltage, the superposition parameter is a superimposition voltage. The control parameter of the electronic governor is adjusted based on the difference between the DC bus voltage and the first voltage threshold as follows. A superimposition voltage is generated based on the difference between the DC bus voltage and the first voltage threshold and a third preset PI control algorithm. Superimposition processing is performed on the superposition voltage and the quadrature axis given voltage based on a direction of the quadrature axis given voltage, such that the electronic governor controls a rotational speed of the motor based on the superimposed quadrature axis given voltage.

In one or more embodiments of the present disclosure, the third preset PI control algorithm may be denoted by a formula of $$Out=K_{Vp}*[(V_{BUS}-V_{SET1})+K_{sI}\int(V_{BUS}-V_{SET1})dt]$$

where $V_{BUS}$ represents the DC bus voltage, $V_{SET1}$ represents the first voltage threshold, $K_{Vp}$ represents a corresponding proportional control parameter, and $K_{VI}$ represents a corresponding integral control parameter.

In addition, before superposition processing, limiting may be performed on the superimposition parameter such as the superimposition voltage, i.e., Out∈[0, $Vq_{Max}$]. If the superimposition voltage is greater than an upper limit value $Vq_{Max}$ of a third limiting range, the superimposition voltage is limited to $Vq_{Max}$, and if the superimposition voltage is less than a lower limit value 0 of the third limiting range, the superimposition voltage is limited to 0.

Further, the superimposition processing is performed on the superposition voltage and the quadrature axis given voltage based on a direction of quadrature axis given voltage as follows. When the direction of the current speed of the motor is a forward direction, the superposition voltage is superimposed to the quadrature axis given voltage. When the direction of the current speed of the motor is a reversal direction, a negative of the superposition voltage is superimposed to the quadrature axis given voltage.

In detail, as illustrated in FIG. 4, after the overvoltage protection function is enabled by software, when the DC bus voltage is less than the first voltage threshold, the superimposition voltage may be limited to 0 by the limiting output of the limiting algorithm Out∈[0, $Vq_{Max}$], such that there is no effect on normal flight.

When the aerial vehicle performs the large action to make the DC bus voltage to exceed the first voltage threshold, the difference of the DC bus voltage minus the first voltage threshold is taken as the input of the third PI control module. The difference is processed by the second preset PI control algorithm Out=$K_{Vp}$*[$(V_{BUS}-V_{SET1})+K_{VI}\int(V_{BUS}-V_{SET1})dt$] to output a positive superimposition voltage and the superimposition voltage is superimposed on the quadrature axis given voltage Vqref by combining with the direction of the speed of the motor. That is, when the direction of the speed of the motor is a forward direction, the superposition voltage Out×1 is superimposed on the quadrature axis given voltage Vqref, when the direction of the speed of the motor is a reversal direction, the superposition voltage Out×(−1) is superimposed on the quadrature axis given voltage Vqref.

Therefore, the quadrature axis given voltage Vqref is adjusted to the quadrature axis given voltage after the superposition voltage is superimposed, and the electronic governor will also control the motor according to the superimposed quadrature axis given voltage. The specific control flow is basically consistent with the control according to the given speed after the superposition speed is superimposed. The difference may be as follows. The quadrature axis given voltage Vqref is superimposed with the superimposition voltage; the space vector modulation unit, based on the estimated angle θ, performs space vector modulation on the direct axis voltage Vd and the quadrature axis voltage after the superimposition to generate a drive signal.

In addition, when the electronic governor has an abnormal condition such as an inputted overvoltage, the DC bus voltage may exceed the second voltage threshold. At this time, the electronic governor stops outputting to control the motor to stop running, and an alarm may also be performed correspondingly.

In conclusion, with the overvoltage protection method for an electronic governor in an aerial vehicle provided in embodiments of the present disclosure, the DC bus voltage of the electronic governor is collected and the DC bus voltage is judged. When the DC bus voltage is greater than the first voltage threshold and less than the second voltage threshold, the control parameter of the electronic governor is adjusted based on the difference between the DC bus voltage and the first voltage threshold, such that the electronic governor controls the motor based on the adjusted control parameter to restrain the further rise of the DC bus voltage. When the DC bus voltage is greater than the second voltage threshold, the electronic governor is controlled to stop outputting, such that the electronic governor controls the motor to stop operating. Therefore, with a two-stage voltage protection adopted in the embodiments of the present disclosure, when the DC bus voltage exceeds the first voltage threshold, the energy fed back from the motor is reduced by adjusting the control parameter, thereby restraining the further rise of the DC bus voltage, and preventing the aerial vehicle from being damaged or crashed because the output of the electronic governor may be cut off due to overvoltage when the aerial vehicle is flying in the large action.

Figure 5:
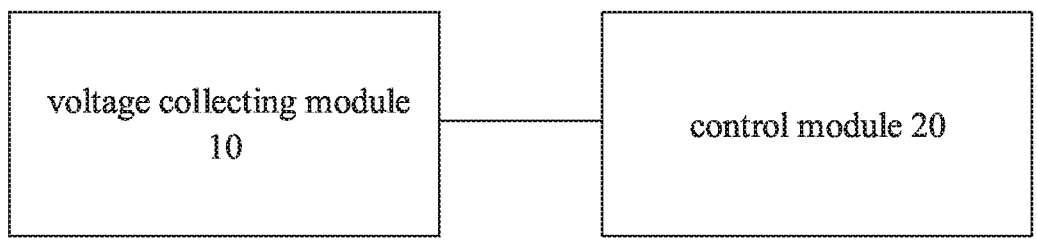
FIG. 5 is a block diagram illustrating an overvoltage protection device for an electronic governor in an aerial vehicle according to an embodiment of the present disclosure.

FIG. 5 is a block diagram illustrating an overvoltage protection device for an electronic governor in an aerial vehicle according to an embodiment of the present disclosure. The electronic governor is configured to control a motor. The electronic governor may include capacitors, MOSFETs and other components.

As illustrated in FIG. 5, the overvoltage protection device according to the embodiment of the present disclosure includes a voltage collecting module 10 and a control module.

The voltage collecting module 10 is configured to collect a DC bus voltage of the electronic governor. It should be noted that, the electronic governor may include a full-bridge inverter circuit composed of six MOSFETs. The full-bridge inverter circuit may include three phase bridge arms. Each phase bridge arm may include two MOSFETs. The DC bus voltage is a voltage applied on the two MOSFETs of each phase bridge arm.

The control module 20 is configured to, when the DC bus voltage is greater than a first voltage threshold and less than or equal to a second voltage threshold, adjust a control parameter of the electronic governor based on a difference between the DC bus voltage and the first voltage threshold, such that the electronic governor controls the motor based on the adjusted control parameter to restrain a further rise of the DC bus voltage.

The control module 20 is further configured to, when the DC bus voltage is greater than the second voltage threshold, control the electronic governor to stop outputting, such that the electronic governor controls the motor to stop operating.

It should be understood that capacitors, MOSFETs and other components in the electronic governor have a voltage limit. If the DC bus voltage is greater than the second voltage threshold, it may cause the voltage applied to the capacitors, MOSFETs, etc. to exceed a voltage limit value itself, thereby damaging or even burning the components.

In one or more embodiments of the present disclosure, the overvoltage protection function of the electronic governor may be enabled by the control module 20 through software, and after the overvoltage protection function is enabled, the DC bus voltage of the electronic governor may be collected by the voltage collecting module 10 in real time.

When the DC bus voltage is less than the first voltage threshold, it is determined at this time that the electronic governor does not have overvoltage. The overvoltage protection is not performed by the control module 20, and the electronic governor may control the motor based on a preset control parameter. Thus, there is no effect on normal flight.

When the DC bus voltage is greater than the first voltage threshold and less than or equal to the second voltage threshold, it is determined at this time that the rise of the DC bus voltage is caused by the large-action flight of the aerial vehicle, i.e., when the aerial vehicle performs the large action during the flight, the motor will rapidly accelerate or decelerate, and when the motor decelerates, the inertia of the motor with the paddles will feed back energy to the electronic governor to rise the DC bus voltage. When the deceleration is faster, the faster the energy is fed back, such that the DC bus voltage may exceed the first voltage threshold. At this time, the control module 20 may adjust the control parameter to reduce a change rate of a rotational speed of the motor, to reduce the energy fed back by the motor, and to restrain the further rise of the DC bus voltage, which may ensure rapid acceleration and deceleration of the electronic governor in the voltage safety range to prevent the electronic components from failing because of the occurrence of the overvoltage of the DC bus voltage.

When the DC bus voltage is greater than the second voltage threshold, it is determined at this time that the overvoltage of the electronic governor is caused by an abnormal condition, i.e., when the electronic governor has an abnormal condition such as an inputted overvoltage, the DC bus voltage may exceed the second voltage threshold. At this time, the control module 20 controls the electronic governor to stop outputting, so as to control the motor to stop running, and an alarm may also be performed correspondingly.

Therefore, with a two-stage voltage protection adopted in the embodiments of the present disclosure, by the effective control on the overvoltage condition that may be generated during the flight, the electronic governor may operate within the safe voltage range, which may reduce the damage of the electronic components caused by the overvoltage of the electronic governor, and thus more safely ensuring the safety of the flight process.

In some embodiments of the present disclosure, the control parameter includes a given speed, a quadrature axis given current or a quadrature axis given voltage. In other words, the overvoltage protection of the DC bus voltage may be performed by the control module 20 through various way, such as by limiting the given speed, the quadrature axis given current or the quadrature axis given voltage.

In detail, in some embodiments of the present disclosure, the control module 20 is further configured to: generate a superimposition parameter based on the difference between the DC bus voltage and the first voltage threshold and a preset PI control algorithm; perform superimposition processing on the superposition parameter and the control parameter based on a direction of a current speed of the motor, such that the electronic governor controls a rotational speed of the motor based on the superimposed control parameter.

Further in some embodiments of the present disclosure, the control module 20 is configured to: when the direction of the current speed of the motor is a forward direction, superimpose the superposition parameter to the control parameter, and when the direction of the current speed of the motor is a reversal direction, superimpose a negative of the superposition parameter to the control parameter.

In the following, with reference to FIGS. 2-4, an overvoltage protection device by limiting the given speed, the quadrature axis given current or the quadrature axis given voltage according to embodiments of the present disclosure will be described.

In a specific embodiment of the present disclosure, as illustrated in FIG. 2, when the control parameter is the given speed, the superposition parameter is a superposition speed. The control module 20 is further configured to perform the following. A superimposition speed is generated based on the difference between the DC bus voltage and the first voltage threshold and a first preset PI control algorithm. Superimposition processing is performed on the superposition speed and the given speed based on a direction of a current speed of the motor, such that the electronic governor controls a rotational speed of the motor based on the superimposed given speed.

In one or more embodiments of the present disclosure, the first preset PI control algorithm may be denoted by a formula of $$\text{Out} = K_{sp} * [(V_{BUS} - V_{SET1}) + K_{sI} \int (V_{BUS} - V_{SET1}) dt]$$

where $V_{BUS}$ represents the DC bus voltage, $V_{SET1}$ represents the first voltage threshold, $K_{sp}$ represents a corresponding proportional control parameter, and $K_{sI}$ represents a corresponding integral control parameter.

In addition, before superposition processing, limiting may be performed by the control module 20 on the superimposition parameter such as the superimposition speed, i.e., Out∈[0, $Spd_{Max}$]. If the superimposition speed is greater than an upper limit value $Spd_{Max}$ of a first limiting range, the superimposition speed is limited to $Spd_{Max}$, and if the superimposition speed is less than a lower limit value 0 of the first limiting range, the superimposition speed is limited to 0.

Further, when the direction of the current speed of the motor is a forward direction, i.e., Sref>0, the superposition speed is superimposed to the given speed Sref by the control module 20. When the direction of the current speed of the motor is a reversal direction, i.e., Sref<0, a negative of the superposition speed is superimposed to the given speed Sref by the control module 20.

In detail, as illustrated in FIG. 2, after the overvoltage protection function is enabled by software, when the DC bus voltage is less than the first voltage threshold, the superimposition speed may be limited to 0 by the control module 20 based on the limiting output of the limiting algorithm Out∈[0, $Spd_{Max}$] of a limiting module 202, such that there is no effect on normal flight.

When the aerial vehicle performs the large action during the flight, the motor will rapidly accelerate or decelerate, and when the motor decelerates, the inertia of the motor with the paddles will feed back energy to the electronic governor to rise the DC bus voltage of the electronic governor. When the deceleration is faster, the faster the energy is fed back, such that the DC bus voltage may exceed the first voltage threshold. At this time, the difference of the DC bus voltage minus the first voltage threshold is taken as the input of the first PI control module 201. The difference is processed by the first preset PI control algorithm Out=$K_{sp}$*[($V_{BUS}$−$V_{SET1}$)+$K_{sI}$∫($V_{BUS}$−$V_{SET1}$)dt] to output a positive superimposition speed and the superimposition speed passes a speed direction module 203 and then is superimposed on the given speed Sref by combining with the direction of the speed of the motor. That is, when the direction of the speed of the motor is a forward direction, the superposition speed Out×1 is superimposed on the given speed Sref, when the direction of the speed of the motor is a reversal direction, the superposition speed Out×(−1) is superimposed on the given speed Sref.

Therefore, the given speed Sref is adjusted to the given speed after the superposition speed is superimposed, and the electronic governor will also control the motor according to the superimposed given speed, which may be as follows.

A collecting module 301 collects currents of three phases, Ia, Ib and Ic and voltages of three phases, Va, Vb and Vc in the motor; a first Clarke coordinate transformation unit 302 transforms the voltages Va, Vb and Vc to obtain voltages of two phases, Vα and Vβ based on Clarke coordinate transformation; a second Clarke coordinate transformation unit 303 transforms the currents Ia, Ib and Ic to obtain currents of two phases, Iα and Iβ based on Clarke coordinate transformation; a position estimating unit 304 such as a velocity flux linkage observer, based on the voltages Vα and Vβ and the current Iα and Iβ, estimates a position and a speed of a rotor of the motor to obtain an estimated angle θ of the rotor and an estimated speed S of the rotor; a park coordinate transformation unit 305 performs park coordinate transformation on the currents Iα and Iβ based on the estimated angle θ of the rotor to obtain a direct axis current Id and a quadrature axis current Iq.

The given speed Sref is superimposed with the superposition speed; a speed correction module 306 performs speed correction on the estimated speed S of the rotor based on the superimposed given speed to obtain the quadrature axis given current Iqref, a first current correction unit 307, based on to the direct axis given current Idref, performs current correction on the direct axis current Id to obtain the direct axis voltage Vd; a second current correction unit 308, based on the quadrature axis given current Idreq, performs current correction on the quadrature axis current Iq to obtain the quadrature axis given voltage Vq; a space vector modulation unit 309, based on the estimated angle θ, performs space vector modulation on the direct axis voltage Vd and the quadrature axis voltage Vq to generate a drive signal; a drive unit 310 drives the motor based on the drive signal.

Thus, during the deceleration, by superimposing the positive or negative superposition speed on the given speed Sref, the rapid decrease of the given speed Sref may be suppressed, thereby reducing the regenerative energy due to the rapid deceleration of the motor with the paddles, restraining the rise of the DC bus voltage and limiting the DC bus voltage below the first preset voltage to ensure rapid acceleration and deceleration of the electronic governor in the voltage safety range to prevent the electronic components from failing because of the occurrence of the overvoltage of the DC bus voltage.

In addition, when the electronic governor has an abnormal condition such as an inputted overvoltage, the DC bus voltage may exceed the second voltage threshold. At this time, the control module 20 controls the electronic governor to stop outputting so as to control the motor to stop running, and an alarm may also be performed correspondingly.

In another specific embodiment of the present disclosure, as illustrated in FIG. 3, when the control parameter is the quadrature axis given current, the superposition parameter is a superposition current. The control module 20 is configured to perform the following. A superimposition current is generated based on the difference between the DC bus voltage and the first voltage threshold and a second preset PI control algorithm. Superimposition processing is performed on the superposition current and the quadrature axis given current based on a direction of the quadrature axis given current, such that the electronic governor controls a rotational speed of the motor based on the superimposed quadrature axis given current.

In one or more embodiments of the present disclosure, the second preset PI control algorithm may be denoted by a formula of $$\text{Out} = K_{Ip} * [(V_{BUS} - V_{SET1}) + K_{II} \int (V_{BUS} - V_{SET1}) dt]$$

where $V_{BUS}$ represents the DC bus voltage, $V_{SET1}$ represents the first voltage threshold, $K_{Ip}$ represents a corresponding proportional control parameter, and $K_{II}$ represents a corresponding integral control parameter.

In addition, before superposition processing, limiting may be performed by the control module 20 on the superimposition parameter such as the superimposition current, i.e., Out∈[0, $Iq_{Max}$]. If the superimposition current is greater than an upper limit value $Iq_{Max}$ of a second limiting range, the superimposition current is limited to $Iq_{Max}$, and if the superimposition current is less than a lower limit value 0 of the second limiting range, the superimposition current is limited to 0.

Further, when the direction of the current speed of the motor is a forward direction, the superposition current is superimposed to the quadrature axis given current by the control module 20. When the direction of the current speed of the motor is a reversal direction, a negative of the superposition current is superimposed to the quadrature axis given current by the control module 20.

In detail, as illustrated in FIG. 3, after the overvoltage protection function is enabled by software, when the DC bus voltage is less than the first voltage threshold, the superimposition current may be limited to 0 by the control module 20 based on the limiting output of the limiting algorithm Out∈[0, $Iq_{Max}$] of a second limiting module 205, such that there is no effect on normal flight.

When the aerial vehicle performs the large action to make the DC bus voltage to exceed the first voltage threshold, the difference of the DC bus voltage minus the first voltage threshold is taken as the input of the second PI control module 205. The difference is processed by the second preset PI control algorithm Out=$K_{Ip}*[(V_{BUS}-V_{SET1})+K_{II}\int(V_{BUS}-V_{SET1})dt]$ to output a positive superimposition current and the superimposition current passes a current direction module 206 and then is superimposed on the quadrature axis given current Iqref by combining with the direction of the speed of the motor. That is, when the direction of the speed of the motor is a forward direction, the superposition current Out×1 is superimposed on the quadrature axis given current Iqref; when the direction of the speed of the motor is a reversal direction, the superposition current Out×(−1) is superimposed on the quadrature axis given current Iqref.

Therefore, the quadrature axis given current Iqref is adjusted to the quadrature axis given current after the superposition current is superimposed, and the electronic governor will also control the motor according to the superimposed quadrature axis given current. The specific control flow of the control module 20 is basically consistent with the control according to the given speed after the superposition speed is superimposed. The difference may be as follows. The speed correction module 306 performs speed correction on the estimated speed S of the rotor based on the given speed to obtain the quadrature axis given current Iqref; the quadrature axis given current Iqref is superimposed with the superimposition current; the second current correction unit 308, based on the quadrature axis given current Idreq after superimposition, performs current correction on the quadrature axis current Iq to obtain the quadrature axis given voltage Vq.

In addition, when the electronic governor has an abnormal condition such as an inputted overvoltage, the DC bus voltage may exceed the second voltage threshold. At this time, the control module 20 controls the electronic governor to stop outputting so as to control the motor to stop running, and an alarm may also be performed correspondingly.

In still another specific embodiment of the present disclosure, as illustrated in FIG. 4, when the control parameter is the quadrature axis given voltage, the superposition parameter is a superposition voltage. The control module 20 is configured to perform the following. A superimposition voltage is generated based on the difference between the DC bus voltage and the first voltage threshold and a third preset PI control algorithm. Superimposition processing is performed on the superposition voltage and the quadrature axis given voltage based on a direction of the quadrature axis given voltage, such that the electronic governor controls a rotational speed of the motor based on the superimposed quadrature axis given voltage.

In one or more embodiments of the present disclosure, the third preset PI control algorithm may be denoted by a formula of Out=$K_{Vp}*[(V_{BUS}-V_{SET1})+K_{VI}\int(V_{BUS}-V_{SET1})dt]$ where $V_{BUS}$ represents the DC bus voltage, $V_{SET1}$ represents the first voltage threshold, $K_{Vp}$ represents a corresponding proportional control parameter, and $K_{VI}$ represents a corresponding integral control parameter.

In addition, before superposition processing, limiting may be performed by the control module 20 on the superimposition parameter such as the superimposition voltage, i.e., Out∈[0, $Vq_{Max}$]. If the superimposition voltage is greater than an upper limit value $Vq_{Max}$ of a third limiting range, the superimposition voltage is limited to $Vq_{Max}$, and if the superimposition voltage is less than a lower limit value 0 of the third limiting range, the superimposition voltage is limited to 0.

Further, when the direction of the current speed of the motor is a forward direction, the superposition voltage is superimposed to the quadrature axis given voltage by the control module 20. When the direction of the current speed of the motor is a reversal direction, a negative of the superposition voltage is superimposed to the quadrature axis given voltage by the control module 20.

In detail, as illustrated in FIG. 4, after the overvoltage protection function is enabled by software, when the DC bus voltage is less than the first voltage threshold, the superimposition voltage may be limited to 0 by the control module 20 based on the limiting output of the limiting algorithm Out∈[0, $Vq_{Max}$] of a third limiting module 208, such that there is no effect on normal flight.

When the aerial vehicle performs the large action to make the DC bus voltage to exceed the first voltage threshold, the difference of the DC bus voltage minus the first voltage threshold is taken as the input of the third PI control module 207. The difference is processed by the second preset PI control algorithm Out=$K_{Vp}*[(V_{BUS}-V_{SET1})+K_{VI}\int(V_{BUS}-V_{SET1})dt]$ to output a positive superimposition voltage and the superimposition voltage passes a voltage direction module 209 and then is superimposed on the quadrature axis given voltage Vqref by combining with the direction of the speed of the motor. That is, when the direction of the speed of the motor is a forward direction, the superposition voltage Out×1 is superimposed on the quadrature axis given voltage Vqref, when the direction of the speed of the motor is a reversal direction, the superposition voltage Out×(−1) is superimposed on the quadrature axis given voltage Vqref.

Therefore, the quadrature axis given voltage Vqref is adjusted to the quadrature axis given voltage after the superposition voltage is superimposed, and the electronic governor will also control the motor according to the superimposed quadrature axis given voltage. The specific control flow of the control module 20 is basically consistent with the control according to the given speed after the superposition speed is superimposed. The difference may be as follows. The quadrature axis given voltage Vqref is superimposed with the superimposition voltage; the space vector modulation unit 309, based on the estimated angle θ, performs space vector modulation on the direct axis voltage Vd and the quadrature axis voltage after the superimposition to generate a drive signal.

In addition, when the electronic governor has an abnormal condition such as an inputted overvoltage, the DC bus voltage may exceed the second voltage threshold. At this time, the control module 20 controls the electronic governor to stop outputting so as to control the motor to stop running, and an alarm may also be performed correspondingly.

In conclusion, with the overvoltage protection device for an electronic governor in an aerial vehicle provided in embodiments of the present disclosure, the DC bus voltage of the electronic governor is collected by the voltage collecting module and the DC bus voltage is judged by the control module. When the DC bus voltage is greater than the first voltage threshold and less than the second voltage threshold, the control parameter of the electronic governor is adjusted by the control module based on the difference between the DC bus voltage and the first voltage threshold, such that the electronic governor controls the motor based on the adjusted control parameter to restrain the further rise of the DC bus voltage. When the DC bus voltage is greater than the second voltage threshold, the electronic governor is controlled by the control module to stop outputting, such that the electronic governor controls the motor to stop operating. Therefore, with a two-stage voltage protection adopted in the embodiments of the present disclosure, when the DC bus voltage exceeds the first voltage threshold, the energy fed back from the motor is reduced by adjusting the control parameter, thereby restraining the further rise of the DC bus voltage, and preventing the aerial vehicle from being damaged or crashed because the output of the electronic governor may be cut off due to overvoltage when the aerial vehicle is flying in the large motion.

Further, an embodiment of the present disclosure provides an aerial vehicle. The aerial vehicle includes the overvoltage protection device for an electronic governor in an aerial vehicle.

With the aerial vehicle provided in embodiments of the present disclosure, based on the overvoltage protection device of the above embodiments, it may prevent the aerial vehicle from being damaged or crashed because the output of the electronic governor may be cut off due to overvoltage when the aerial vehicle is flying in the large motion.

In the description of the present disclosure, it is to be understood that, terms such as "center", "longitudinal", "lateral", "length", "width", "thickness", "over", "below", "front", "back", "left", "right", "vertical", "horizontal", "top", "bottom", "in", "out", "clockwise", "anti-clockwise", "axial", "radial" and "circumference" refer to the directions and location relations which are the directions and location relations shown in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure.

In addition, terms such as "first" and "second" are used herein for purposes of description and are not intended to indicate or imply relative importance or significance. Furthermore, the feature defined with "first" and "second" may comprise one or more this feature distinctly or implicitly. In the description of the present disclosure, "a plurality of" means two or more than two, unless specified otherwise.

In the present disclosure, unless specified or limited otherwise, the terms "mounted," "connected," "coupled" and "fixed" are understood broadly, such as fixed, detachable mountings, connections and couplings or integrated, and can be mechanical or electrical mountings, connections and couplings, and also can be direct and via media indirect mountings, connections, and couplings, and further can be inner mountings, connections and couplings of two components or interaction relations between two components, which can be understood by those skilled in the art according to the detail embodiment of the present disclosure.

In the present disclosure, unless specified or limited otherwise, the first characteristic is "on" or "under" the second characteristic refers to the first characteristic and the second characteristic can be direct or via media indirect mountings, connections, and couplings. And, the first characteristic is "on", "above", "over" the second characteristic may refer to the first characteristic is right over the second characteristic or is diagonal above the second characteristic, or just refer to the horizontal height of the first characteristic is higher than the horizontal height of the second characteristic. The first characteristic is "below" or "under" the second characteristic may refer to the first characteristic is right over the second characteristic or is diagonal under the second characteristic, or just refer to the horizontal height of the first characteristic is lower than the horizontal height of the second characteristic.

In the description of the present disclosure, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples can be combined by those skilled in the art.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. An overvoltage protection method for an electronic governor in an aerial vehicle, wherein the electronic governor is configured to control a motor, and the method comprises:
    collecting a direct current (DC) bus voltage of the electronic governor;
    when the DC bus voltage is greater than a first voltage threshold and less than or equal to a second voltage threshold, adjusting a control parameter of the electronic governor based on a difference between the DC bus voltage and the first voltage threshold, such that the electronic governor controls the motor based on the adjusted control parameter to restrain a further rise of the DC bus voltage, wherein the second voltage threshold is greater than the first voltage threshold,
    wherein adjusting the control parameter of the electronic governor based on the difference between the DC bus voltage and the first voltage threshold, comprises:
        generating a superimposition parameter based on the difference between the DC bus voltage and the first voltage threshold and a preset PI control algorithm; and performing superimposition processing on the superposition parameter and the control parameter based on a direction of a current speed of the motor, such that the electronic governor controls a rotational speed of the motor based on the superimposed control parameter, and wherein performing the superimposition processing on the superposition parameter and the control parameter based on the direction of the current speed of the motor, comprises:

when the direction of the current speed of the motor is a forward direction, superimposing the superposition parameter to the control parameter; and when the direction of the current speed of the motor is a reversal direction, superimposing a negative of the superposition parameter to the control parameter.

2. The method according to claim 1, wherein the control parameter comprises a given speed, a quadrature axis given current or a quadrature axis given voltage.

3. The method according to claim 1, further comprising:

when the DC bus voltage is greater than the second voltage threshold, controlling the electronic governor to stop outputting, such that the electronic governor controls the motor to stop operating.

4. An overvoltage protection device for an electronic governor in an aerial vehicle, wherein the electronic governor is configured to control a motor, and the device comprises:

a memory comprising computer-executable instructions stored thereon; and a processor, which is configured by the instructions to implement acts of:

collecting a direct current (DC) bus voltage of the electronic governor;

when the DC bus voltage is greater than a first voltage threshold and less than or equal to a second voltage threshold, adjusting a control parameter of the electronic governor based on a difference between the DC bus voltage and the first voltage threshold, such that the electronic governor controls the motor based on the adjusted control parameter to restrain a further rise of the DC bus voltage, wherein the second voltage threshold is greater than the first voltage threshold, wherein adjusting the control parameter of the electronic governor based on the difference between the DC bus voltage and the first voltage threshold, comprises:

generating a superimposition parameter based on the difference between the DC bus voltage and the first voltage threshold and a preset PI control algorithm; and performing superimposition processing on the superposition parameter and the control parameter based on a direction of a current speed of the motor, such that the electronic governor controls a rotational speed of the motor based on the superimposed control parameter, and wherein performing the superimposition processing on the superposition parameter and the control parameter based on the direction of the current speed of the motor, comprises:

when the direction of the current speed of the motor is a forward direction, superimposing the superposition parameter to the control parameter; and when the direction of the current speed of the motor is a reversal direction, superimposing a negative of the superposition parameter to the control parameter.

5. The device according to claim 4, wherein the control parameter comprises a given speed, a quadrature axis given current or a quadrature axis given voltage.

6. The device according to claim 4, wherein the processor is configured by the instructions to implement acts of:

when the DC bus voltage is greater than the second voltage threshold, controlling the electronic governor to stop outputting, such that the electronic governor controls the motor to stop operating.

7. An aerial vehicle comprising:

an electronic governor;

a motor, wherein the electronic governor is configured to control the motor;

a memory comprising computer-executable instructions stored thereon; and a processor, which is configured by the instructions to implement acts of:

collecting a direct current (DC) bus voltage of the electronic governor;

when the DC bus voltage is greater than a first voltage threshold and less than or equal to a second voltage threshold, adjusting a control parameter of the electronic governor based on a difference between the DC bus voltage and the first voltage threshold, such that the electronic governor controls the motor based on the adjusted control parameter to restrain a further rise of the DC bus voltage, wherein the second voltage threshold is greater than the first voltage threshold, wherein adjusting the control parameter of the electronic governor based on the difference between the DC bus voltage and the first voltage threshold, comprises:

generating a superimposition parameter based on the difference between the DC bus voltage and the first voltage threshold and a preset PI control algorithm; and performing superimposition processing on the superposition parameter and the control parameter based on a direction of a current speed of the motor, such that the electronic governor controls a rotational speed of the motor based on the superimposed control parameter, and wherein performing the superimposition processing on the superposition parameter and the control parameter based on the direction of the current speed of the motor, comprises:

when the direction of the current speed of the motor is a forward direction, superimposing the superposition parameter to the control parameter; and when the direction of the current speed of the motor is a reversal direction, superimposing a negative of the superposition parameter to the control parameter.

8. The aerial vehicle according to claim 7, wherein the control parameter comprises a given speed, a quadrature axis given current or a quadrature axis given voltage.

9. The aerial vehicle according to claim 7, wherein the processor is configured by the instructions to implement acts of:

when the DC bus voltage is greater than the second voltage threshold, controlling the electronic governor to stop outputting, such that the electronic governor controls the motor to stop operating.

* * * * *